US011615831B2

(12) United States Patent
Yamamoto

(10) Patent No.: US 11,615,831 B2
(45) Date of Patent: Mar. 28, 2023

(54) APPARATUSES AND METHODS FOR MEMORY MAT REFRESH SEQUENCING

(71) Applicant: MICRON TECHNOLOGY, INC., Boise, ID (US)

(72) Inventor: Nobuo Yamamoto, Tokyo (JP)

(73) Assignee: MICRON TECHNOLOGY, INC., Boise, ID (US)

( * ) Notice: Subject to any disclaimer, the term of this patent is extended or adjusted under 35 U.S.C. 154(b) by 0 days.

(21) Appl. No.: 16/286,187

(22) Filed: Feb. 26, 2019

(65) Prior Publication Data

US 2020/0273517 A1    Aug. 27, 2020

(51) Int. Cl.
*G11C 11/406*    (2006.01)
*G11C 11/408*    (2006.01)
*G11C 11/4091*    (2006.01)

(52) U.S. Cl.
CPC ..... *G11C 11/40611* (2013.01); *G11C 11/4085* (2013.01); *G11C 11/4091* (2013.01); *G11C 11/4087* (2013.01)

(58) Field of Classification Search
CPC .......... G11C 11/40611; G11C 11/4085; G11C 11/4091; G11C 11/4087
USPC ........................................................ 365/222
See application file for complete search history.

(56) References Cited

U.S. PATENT DOCUMENTS

| | | | |
|---|---|---|---|
| 5,299,159 A | 3/1994 | Balistreri et al. | |
| 5,654,929 A * | 8/1997 | Mote, Jr. | G11C 11/408 365/222 |
| 5,867,442 A | 2/1999 | Kim et al. | |
| 5,956,288 A * | 9/1999 | Bermingham | G11C 8/12 365/230.06 |
| 5,959,923 A * | 9/1999 | Matteson | G11C 11/406 365/222 |
| 5,999,471 A | 12/1999 | Choi | |
| 6,002,629 A | 12/1999 | Kim et al. | |
| 6,064,621 A | 5/2000 | Tanizaki et al. | |
| 6,306,721 B1 | 10/2001 | Teo et al. | |
| 6,310,814 B1 * | 10/2001 | Hampel | G11C 11/406 365/230.03 |
| 6,363,024 B1 | 3/2002 | Fibranz | |
| 6,392,952 B1 | 5/2002 | Chen et al. | |

(Continued)

FOREIGN PATENT DOCUMENTS

CN    104350546 A    2/2015
CN    106710621 A    5/2017

(Continued)

OTHER PUBLICATIONS

U.S. Appl. No. 16/549,411 titled "Apparatuses and Methods for Dynamic Refresh Allocation" filed Aug. 23, 2019.

(Continued)

*Primary Examiner* — Sung Il Cho
(74) *Attorney, Agent, or Firm* — Dorsey & Whitney LLP

(57) ABSTRACT

Embodiments of the disclosure are drawn to apparatuses and methods for a sequence of refreshing memory mats. During a refresh operation, wordlines of the memory may be refreshed in a sequence. Groups of wordlines may be organized into memory mats. In order to prevent noise, each time a wordline in a memory mat is refreshed, the next wordline to be refreshed may be in a mat which is not physically adjacent to the mat containing the previously refreshed wordline.

15 Claims, 6 Drawing Sheets

(56) References Cited

U.S. PATENT DOCUMENTS

| | | |
|---|---|---|
| 6,535,950 B1 | 3/2003 | Funyu et al. |
| 7,002,868 B2 | 2/2006 | Takahashi |
| 7,082,070 B2 | 7/2006 | Hong |
| 7,203,113 B2 | 4/2007 | Takahashi et al. |
| 7,692,993 B2 | 4/2010 | Iida et al. |
| 8,174,921 B2 | 5/2012 | Kim et al. |
| 8,400,805 B2 | 3/2013 | Yoko |
| 8,572,423 B1 | 10/2013 | Isachar et al. |
| 9,076,499 B2 | 7/2015 | Schoenborn et al. |
| 9,236,110 B2 | 1/2016 | Bains et al. |
| 9,251,885 B2 | 2/2016 | Greenfield et al. |
| 9,299,400 B2 | 3/2016 | Bains et al. |
| 9,311,984 B1 | 4/2016 | Hong et al. |
| 9,396,786 B2 | 7/2016 | Yoon et al. |
| 9,406,358 B1 | 8/2016 | Lee |
| 9,418,723 B2* | 8/2016 | Chishti .............. G11C 11/40611 |
| 9,570,201 B2 | 2/2017 | Morgan et al. |
| 9,653,139 B1 | 5/2017 | Park |
| 9,685,240 B1 | 6/2017 | Park |
| 9,691,466 B1 | 6/2017 | Kim |
| 9,734,887 B1 | 8/2017 | Tavva |
| 9,761,297 B1 | 9/2017 | Tomishima |
| 9,812,185 B2 | 11/2017 | Fisch et al. |
| 9,818,469 B1 | 11/2017 | Kim et al. |
| 9,831,003 B2 | 11/2017 | Sohn et al. |
| 9,865,328 B1 | 1/2018 | Desimone et al. |
| 9,978,430 B2 | 5/2018 | Seo et al. |
| 10,020,045 B2 | 7/2018 | Riho |
| 10,020,048 B2 | 7/2018 | Uemura |
| 10,049,716 B2 | 8/2018 | Proebsting |
| 10,090,038 B2 | 10/2018 | Shin |
| 10,141,042 B1 | 11/2018 | Richter |
| 10,170,174 B1 | 1/2019 | Ito et al. |
| 10,192,608 B2 | 1/2019 | Morgan |
| 10,297,307 B1 | 5/2019 | Raad et al. |
| 10,381,327 B2 | 8/2019 | Ramachandra et al. |
| 10,446,256 B2 | 10/2019 | Ong et al. |
| 10,468,076 B1 | 11/2019 | He et al. |
| 10,490,250 B1 | 11/2019 | Ito et al. |
| 10,504,577 B1 | 12/2019 | Alzheimer |
| 10,510,396 B1* | 12/2019 | Notani ................. G11C 5/147 |
| 10,572,377 B1 | 2/2020 | Zhang et al. |
| 10,573,370 B2 | 2/2020 | Ito et al. |
| 10,607,679 B2 | 3/2020 | Nakaoka |
| 10,685,696 B2 | 6/2020 | Brown et al. |
| 10,699,796 B2 | 6/2020 | Benedict et al. |
| 10,790,005 B1 | 9/2020 | He et al. |
| 10,825,505 B2 | 11/2020 | Rehmeyer |
| 10,832,792 B1 | 11/2020 | Penney et al. |
| 10,930,335 B2 | 2/2021 | Bell et al. |
| 10,943,636 B1 | 3/2021 | Wu et al. |
| 10,950,289 B2 | 3/2021 | Ito et al. |
| 10,957,377 B2 | 3/2021 | Noguchi |
| 10,964,378 B2 | 3/2021 | Ayyapureddi et al. |
| 10,978,132 B2 | 4/2021 | Rehmeyer et al. |
| 11,017,833 B2 | 5/2021 | Wu et al. |
| 11,081,160 B2 | 8/2021 | Ito et al. |
| 11,302,377 B2 | 4/2022 | Li et al. |
| 11,380,382 B2 | 7/2022 | Zhang et al. |
| 11,417,383 B2 | 8/2022 | Jenkinson et al. |
| 2002/0026613 A1 | 2/2002 | Niiro |
| 2002/0191467 A1* | 12/2002 | Matsumoto ....... G11C 11/40611 365/222 |
| 2003/0026161 A1* | 2/2003 | Yamaguchi .......... G11C 7/1006 365/230.03 |
| 2003/0067825 A1* | 4/2003 | Shimano ............. G11C 11/406 365/222 |
| 2003/0081483 A1* | 5/2003 | De Paor .............. G11C 7/1018 365/222 |
| 2003/0161208 A1 | 8/2003 | Nakashima et al. |
| 2003/0231540 A1 | 12/2003 | Lazar et al. |
| 2004/0024955 A1 | 2/2004 | Patel |
| 2005/0002268 A1 | 1/2005 | Otsuka et al. |
| 2005/0105362 A1* | 5/2005 | Choi ................ G11C 11/40618 365/222 |
| 2005/0108460 A1 | 5/2005 | David |
| 2005/0213408 A1* | 9/2005 | Shieh .................... G11C 11/406 365/222 |
| 2005/0243627 A1 | 11/2005 | Lee et al. |
| 2005/0265104 A1 | 12/2005 | Remaklus et al. |
| 2006/0018174 A1* | 1/2006 | Park .................. G11C 11/40611 365/222 |
| 2006/0104139 A1* | 5/2006 | Hur .................. G11C 11/40615 365/222 |
| 2006/0198220 A1* | 9/2006 | Yoon .................. G11C 11/4091 365/205 |
| 2006/0215474 A1 | 9/2006 | Hokenmaier |
| 2006/0233012 A1 | 10/2006 | Sekiguchi et al. |
| 2006/0262617 A1 | 11/2006 | Lee |
| 2006/0268643 A1 | 11/2006 | Schreck et al. |
| 2007/0002651 A1 | 1/2007 | Lee |
| 2007/0014175 A1 | 1/2007 | Min et al. |
| 2007/0028068 A1 | 2/2007 | Golding et al. |
| 2007/0147154 A1 | 6/2007 | Lee |
| 2007/0263442 A1 | 11/2007 | Cornwell et al. |
| 2008/0212386 A1 | 9/2008 | Riho |
| 2008/0224742 A1 | 9/2008 | Pomichter |
| 2008/0253212 A1 | 10/2008 | Iida et al. |
| 2008/0253213 A1 | 10/2008 | Sato et al. |
| 2008/0270683 A1 | 10/2008 | Barth et al. |
| 2008/0306723 A1 | 12/2008 | De et al. |
| 2009/0021999 A1 | 1/2009 | Tanimura et al. |
| 2009/0052264 A1 | 2/2009 | Hong et al. |
| 2009/0059641 A1 | 3/2009 | Jeddeloh |
| 2009/0073760 A1 | 3/2009 | Betser et al. |
| 2009/0161468 A1 | 6/2009 | Fujioka |
| 2009/0168571 A1 | 7/2009 | Pyo et al. |
| 2009/0228739 A1 | 9/2009 | Cohen et al. |
| 2009/0296510 A1 | 12/2009 | Lee et al. |
| 2010/0005376 A1 | 1/2010 | Laberge et al. |
| 2010/0061153 A1 | 3/2010 | Yen et al. |
| 2010/0097870 A1 | 4/2010 | Kim et al. |
| 2010/0110809 A1 | 5/2010 | Kobayashi |
| 2010/0124138 A1 | 5/2010 | Lee et al. |
| 2010/0128547 A1 | 5/2010 | Kagami |
| 2010/0141309 A1 | 6/2010 | Lee |
| 2010/0182862 A1 | 7/2010 | Teramoto |
| 2010/0182863 A1* | 7/2010 | Fukiage ............ G11C 11/40618 365/222 |
| 2011/0055495 A1 | 3/2011 | Remaklus et al. |
| 2011/0134715 A1 | 6/2011 | Norman |
| 2011/0225355 A1 | 9/2011 | Kajigaya |
| 2011/0299352 A1 | 12/2011 | Fujishiro et al. |
| 2012/0014199 A1 | 1/2012 | Narui |
| 2012/0155173 A1 | 6/2012 | Lee et al. |
| 2012/0155206 A1 | 6/2012 | Kodama et al. |
| 2012/0254472 A1 | 10/2012 | Ware et al. |
| 2012/0287727 A1* | 11/2012 | Wang ............... G11C 11/40618 365/189.05 |
| 2012/0307582 A1 | 12/2012 | Marumoto et al. |
| 2012/0327734 A1 | 12/2012 | Sato |
| 2013/0028034 A1 | 1/2013 | Fujisawa |
| 2013/0051157 A1 | 2/2013 | Park |
| 2013/0051171 A1 | 2/2013 | Porter et al. |
| 2013/0077423 A1 | 3/2013 | Lee |
| 2013/0254475 A1* | 9/2013 | Perego ................. G11C 11/406 711/106 |
| 2013/0279284 A1 | 10/2013 | Jeong |
| 2014/0006700 A1 | 1/2014 | Schaefer et al. |
| 2014/0013169 A1 | 1/2014 | Kobla et al. |
| 2014/0013185 A1 | 1/2014 | Kobla et al. |
| 2014/0016422 A1 | 1/2014 | Kim et al. |
| 2014/0022858 A1 | 1/2014 | Chen et al. |
| 2014/0043888 A1 | 2/2014 | Chen et al. |
| 2014/0089758 A1 | 3/2014 | Kwok et al. |
| 2014/0095780 A1 | 4/2014 | Bains et al. |
| 2014/0119091 A1* | 5/2014 | You ...................... G11C 11/402 365/72 |
| 2014/0143473 A1* | 5/2014 | Kim .................. G11C 16/3418 711/103 |
| 2014/0169114 A1 | 6/2014 | Oh |

(56) References Cited

U.S. PATENT DOCUMENTS

| | | |
|---|---|---|
| 2014/0177370 A1 | 6/2014 | Halbert et al. |
| 2014/0181453 A1 | 6/2014 | Jayasena et al. |
| 2014/0185403 A1* | 7/2014 | Lai .................... G11C 11/40618 365/222 |
| 2014/0189228 A1 | 7/2014 | Greenfield et al. |
| 2014/0219042 A1 | 8/2014 | Yu et al. |
| 2014/0321226 A1 | 10/2014 | Pyeon |
| 2015/0016203 A1 | 1/2015 | Sriramagiri et al. |
| 2015/0036445 A1 | 2/2015 | Yoshida et al. |
| 2015/0049566 A1 | 2/2015 | Lee et al. |
| 2015/0049567 A1 | 2/2015 | Chi |
| 2015/0078112 A1* | 3/2015 | Huang .............. G11C 11/40618 365/222 |
| 2015/0085564 A1 | 3/2015 | Yoon et al. |
| 2015/0092508 A1* | 4/2015 | Bains ................ G11C 11/40618 365/222 |
| 2015/0109871 A1 | 4/2015 | Bains et al. |
| 2015/0120999 A1 | 4/2015 | Kim et al. |
| 2015/0134897 A1* | 5/2015 | Sriramagiri ....... G11C 11/40615 711/106 |
| 2015/0155025 A1 | 6/2015 | Lee et al. |
| 2015/0162064 A1 | 6/2015 | Oh et al. |
| 2015/0206572 A1 | 7/2015 | Lim et al. |
| 2015/0213872 A1 | 7/2015 | Mazumder et al. |
| 2015/0356048 A1 | 12/2015 | King |
| 2015/0380073 A1 | 12/2015 | Joo et al. |
| 2016/0027498 A1 | 1/2016 | Ware et al. |
| 2016/0070483 A1 | 3/2016 | Yoon et al. |
| 2016/0078846 A1 | 3/2016 | Liu et al. |
| 2016/0125931 A1 | 5/2016 | Doo et al. |
| 2016/0155491 A1 | 6/2016 | Roberts |
| 2016/0180917 A1 | 6/2016 | Chishti et al. |
| 2016/0180921 A1* | 6/2016 | Jeong ................ G11C 11/40611 365/222 |
| 2016/0202926 A1 | 7/2016 | Benedict |
| 2016/0225433 A1 | 8/2016 | Bains et al. |
| 2016/0343423 A1 | 11/2016 | Shido |
| 2017/0011792 A1 | 1/2017 | Oh et al. |
| 2017/0052722 A1 | 2/2017 | Ware et al. |
| 2017/0092350 A1 | 3/2017 | Halbert et al. |
| 2017/0111792 A1 | 4/2017 | Correia Fernandes et al. |
| 2017/0133085 A1 | 5/2017 | Kim et al. |
| 2017/0133108 A1 | 5/2017 | Lee et al. |
| 2017/0140807 A1 | 5/2017 | Sun et al. |
| 2017/0140810 A1 | 5/2017 | Choi et al. |
| 2017/0140811 A1 | 5/2017 | Joo |
| 2017/0148504 A1 | 5/2017 | Saifuddin et al. |
| 2017/0148598 A1 | 5/2017 | Kim et al. |
| 2017/0186481 A1 | 6/2017 | Oh et al. |
| 2017/0263305 A1 | 9/2017 | Cho |
| 2017/0269861 A1 | 9/2017 | Lu et al. |
| 2017/0287547 A1 | 10/2017 | Ito et al. |
| 2017/0345482 A1 | 11/2017 | Balakrishnan |
| 2017/0352404 A1 | 12/2017 | Lee et al. |
| 2018/0005690 A1 | 1/2018 | Morgan et al. |
| 2018/0025772 A1 | 1/2018 | Lee et al. |
| 2018/0025773 A1 | 1/2018 | Bains et al. |
| 2018/0033479 A1* | 2/2018 | Lea .......................... G11C 8/12 |
| 2018/0047110 A1 | 2/2018 | Blackman et al. |
| 2018/0061476 A1 | 3/2018 | Kim |
| 2018/0061485 A1 | 3/2018 | Joo |
| 2018/0075927 A1 | 3/2018 | Jeong et al. |
| 2018/0096719 A1* | 4/2018 | Tomishima ............ G11C 5/025 |
| 2018/0108401 A1 | 4/2018 | Choi et al. |
| 2018/0114561 A1 | 4/2018 | Fisch et al. |
| 2018/0114565 A1* | 4/2018 | Lee .................... G11C 11/4087 |
| 2018/0122454 A1 | 5/2018 | Lee et al. |
| 2018/0130506 A1 | 5/2018 | Kang et al. |
| 2018/0137005 A1 | 5/2018 | Wu et al. |
| 2018/0158504 A1 | 6/2018 | Akamatsu |
| 2018/0158507 A1 | 6/2018 | Bang |
| 2018/0190340 A1 | 7/2018 | Kim et al. |
| 2018/0218767 A1 | 8/2018 | Wolff |
| 2018/0226119 A1 | 8/2018 | Kim et al. |
| 2018/0233197 A1 | 8/2018 | Laurent |
| 2018/0240511 A1 | 8/2018 | Yoshida et al. |
| 2018/0247876 A1 | 8/2018 | Kim et al. |
| 2018/0254078 A1 | 9/2018 | We et al. |
| 2018/0261268 A1 | 9/2018 | Hyun et al. |
| 2018/0276150 A1 | 9/2018 | Eckert et al. |
| 2018/0285007 A1 | 10/2018 | Franklin et al. |
| 2018/0294028 A1 | 10/2018 | Lee et al. |
| 2018/0308539 A1 | 10/2018 | Ito et al. |
| 2019/0043558 A1* | 2/2019 | Suh ................... G11C 11/40618 |
| 2019/0065087 A1 | 2/2019 | Li et al. |
| 2019/0066759 A1 | 2/2019 | Nale |
| 2019/0066766 A1 | 2/2019 | Lee |
| 2019/0088315 A1 | 3/2019 | Saenz et al. |
| 2019/0088316 A1 | 3/2019 | Inuzuka et al. |
| 2019/0115069 A1 | 4/2019 | Lai |
| 2019/0122723 A1 | 4/2019 | Ito et al. |
| 2019/0129651 A1 | 5/2019 | Wuu et al. |
| 2019/0130960 A1 | 5/2019 | Kim |
| 2019/0161341 A1 | 5/2019 | Howe |
| 2019/0190341 A1 | 6/2019 | Beisele et al. |
| 2019/0196730 A1 | 6/2019 | Imran |
| 2019/0205253 A1 | 7/2019 | Roberts |
| 2019/0252020 A1 | 8/2019 | Rios et al. |
| 2019/0279706 A1 | 9/2019 | Kim |
| 2019/0294348 A1* | 9/2019 | Ware ................. G11C 11/40611 |
| 2019/0333573 A1 | 10/2019 | Shin et al. |
| 2019/0347019 A1 | 11/2019 | Shin et al. |
| 2019/0348102 A1 | 11/2019 | Smith et al. |
| 2019/0362774 A1 | 11/2019 | Kuramori et al. |
| 2019/0385661 A1 | 12/2019 | Koo et al. |
| 2019/0385667 A1 | 12/2019 | Morohashi et al. |
| 2019/0385668 A1 | 12/2019 | Fujioka et al. |
| 2019/0385670 A1* | 12/2019 | Notani ............. G11C 29/50008 |
| 2019/0391760 A1 | 12/2019 | Miura et al. |
| 2019/0392886 A1 | 12/2019 | Cox et al. |
| 2020/0051616 A1 | 2/2020 | Cho |
| 2020/0075086 A1 | 3/2020 | Hou et al. |
| 2020/0082873 A1 | 3/2020 | Wolff |
| 2020/0126611 A1 | 4/2020 | Riho et al. |
| 2020/0135263 A1 | 4/2020 | Brown et al. |
| 2020/0143871 A1 | 5/2020 | Kim et al. |
| 2020/0176050 A1 | 6/2020 | Ito et al. |
| 2020/0185026 A1 | 6/2020 | Yun et al. |
| 2020/0194056 A1 | 6/2020 | Sakurai et al. |
| 2020/0210278 A1 | 7/2020 | Rooney et al. |
| 2020/0211633 A1 | 7/2020 | Okuma |
| 2020/0211634 A1 | 7/2020 | Ishikawa et al. |
| 2020/0219556 A1 | 7/2020 | Ishikawa et al. |
| 2020/0265888 A1 | 8/2020 | Ito et al. |
| 2020/0273518 A1 | 8/2020 | Raad et al. |
| 2020/0279599 A1 | 9/2020 | Ware et al. |
| 2020/0294569 A1 | 9/2020 | Wu et al. |
| 2020/0294576 A1 | 9/2020 | Brown et al. |
| 2020/0321049 A1 | 10/2020 | Meier et al. |
| 2020/0381040 A1 | 12/2020 | Penney et al. |
| 2020/0388324 A1 | 12/2020 | Rehmeyer et al. |
| 2020/0388325 A1 | 12/2020 | Cowles et al. |
| 2020/0395063 A1 | 12/2020 | Rehmeyer |
| 2021/0057021 A1 | 2/2021 | Wu et al. |
| 2021/0118491 A1 | 4/2021 | Li et al. |
| 2021/0166752 A1 | 6/2021 | Noguchi |
| 2021/0183433 A1 | 6/2021 | Jenkinson et al. |
| 2021/0183435 A1 | 6/2021 | Meier et al. |
| 2021/0225431 A1 | 7/2021 | Rehmeyer et al. |
| 2021/0304813 A1 | 9/2021 | Cowles et al. |
| 2021/0335411 A1 | 10/2021 | Wu et al. |
| 2021/0406170 A1 | 12/2021 | Jung et al. |
| 2022/0093165 A1 | 3/2022 | Mitsubori et al. |
| 2022/0165328 A1 | 5/2022 | Ishikawa et al. |
| 2022/0189539 A1 | 6/2022 | Li et al. |
| 2022/0199144 A1 | 6/2022 | Roberts |
| 2022/0270670 A1 | 8/2022 | Wu et al. |

FOREIGN PATENT DOCUMENTS

| | | |
|---|---|---|
| CN | 107871516 A | 4/2018 |
| JP | 4911510 B2 | 1/2012 |

(56) References Cited

FOREIGN PATENT DOCUMENTS

| JP | 6281030 B1 | 1/2018 |
|---|---|---|
| WO | 2020117686 A1 | 6/2020 |
| WO | 2020247163 A1 | 12/2020 |

OTHER PUBLICATIONS

U.S. Appl. No. 16/783,063, titled "Apparatus and Methods for Triggering Row Hammer Address Sampling", dated Feb. 5, 2020.
U.S. Appl. No. 16/537,981 titled "Apparatuses and Methods for Controlling Targeted Refresh Rates" filed Aug. 12, 2019.
U.S. Appl. No. 16/682,606, titled "Apparatuses and Methods for Distributing Row Hammer Refresh Events Across a Memory Device", filed Nov. 13, 2019.
International Application No. PCT/US19/40169 titled "Apparatus and Methods for Triggering Row Hammer Address Sampling" filed Jul. 1, 2019.
U.S. Appl. No. 16/431,641 titled "Apparatuses and Methods for Controlling Steal Rates" filed Jun. 4, 2019.
U.S. Appl. No. 16/025,844, titled "Apparatus and Methods for Triggering Row Hammer Address Sampling", filed Jul. 2, 2018.
U.S. Appl. No. 16/084,119, titled "Apparatuses and Methods for Pure-Time, Self Adopt Sampling for Row Hammer Refresh Sampling", filed Sep. 11, 2018.
U.S. Appl. No. 16/176,932, titled "Apparatuses and Methods for Access Based Refresh Timing", filed Oct. 31, 2018.
U.S. Appl. No. 16/230,300, titled "Apparatuses and Methods for Staggered Timing of Targeted Refresh Operations" filed Dec. 21, 2018.
U.S. Appl. No. 16/232,837, titled "Apparatuses and Methods for Distributed Targeted Refresh Operations", filed Dec. 26, 2018.
U.S. Appl. No. 16/290,730, titled "Semiconductor Device Performing Row Hammer Refresh Operation", filed Mar. 1, 2019.
U.S. Appl. No. 16/374,623, titled "Semiconductor Device Performing Row Hammer Refresh Operation", filed Apr. 3, 2019.
U.S. Appl. No. 16/375,716 titled "Stagger RHR Pumping Scheme Across Die Banks" filed Apr. 4, 2019; pp. all.
U.S. Appl. No. 16/655,110 titled "Apparatuses and Methods for Dynamic Targeted Refresh Steals" filed Oct. 16, 2019.
U.S. Appl. No. 16/886,284, titled "Apparatuses and Methods for Access Based Refresh Timing", dated May 28, 2020.
U.S. Appl. No. 16/788,657, titled "Semiconductor Device Performing Row Hammer Refresh Operation", dated Feb. 12, 2020.
U.S. Appl. No. 16/818,989, titled "Semiconductor Device Performing Row Hammer Refresh Operation", dated Mar. 13, 2020.
U.S. Appl. No. 16/818,981 titled "Apparatuses and Methods for Staggered Timing of Targeted Refresh Operations" filed Mar. 13, 2020.
U.S. Appl. No. 16/208,217, titled "Semiconductor Device Performing Row Hammer Refresh Operation", filed Dec. 3, 2018.
U.S. Appl. No. 16/824,460, titled "Semiconductor Device Performing Row Hammer Refresh Operation", dated Mar. 19, 2020.
International Search Report & Written Opinion dated Aug. 28, 2020 for PCT Application No. PCT/US2020/032931.
International Search Report and Written Opinion for PCT/US2020/026689 dated Jul. 22, 2020.
U.S. Appl. No. 17/008,396 titled "Apparatuses and Methods for Staggered Timing of Targeted Refresh Operations" filed Aug. 31, 2020.
IPRP dated Dec. 3, 2020 for PCT Application No. PCT/CN2018/088203.
U.S. Appl. No. 16/548,027 titled "Apparatuses, Systems, and Methods for Analog Row Access Rate Determination" filed Aug. 22, 2019.
U.S. Appl. No. 16/549,942 titled "Apparatuses and Methods for Lossy Row Access Counting" filed Aug. 23, 2019.
U.S. Appl. No. 16/997,766 titled "Refresh Logic Circuit Layouts Thereof" filed Aug. 19, 2020.
U.S. Appl. No. 17/095,978 titled "Apparatuses and Methods for Controlled Refresh Timing" filed Nov. 12, 2020.
U.S. Appl. No. 17/175,485 titled "Apparatuses and Methods for Distributed Targeted Refresh Operations" filed Feb. 12, 2021.
U.S. Appl. No. 17/303,018, titled "Apparatuses and Methods for Controlling Refresh Operations", filed Sep. 23, 2020, pp. all.
U.S. Appl. No. 17/324,621 titled "Apparatuses And Methods for Pure-Time, Self-Adopt Sampling For Row Hammer Refresh Sampling" filed May 19, 2021.
U.S. Appl. No. 16/994,338 titled "Apparatuses, Systems, and Methods for Memory Directed Access Pause" filed Aug. 14. 2020.
U.S. Appl. No. 16/997,659 titled "Apparatuses, Systems, and Methods for Refresh Modes" filed Aug. 19, 2020.
U.S. Appl. No. 17/127,654 titled "Apparatuses and Methods for Row Hammer Based Cache Lockdown" filed Dec. 18, 2020.
U.S. Appl. No. 17/347,957 titled "Apparatuses and Methods for Controlling Steal Rates" filed Jun. 15, 2021.
"IPRP for PCT/US2020/026689, mailed Sep. 28, 2021".
U.S. Appl. No. 17/731,529, titled "Apparatuses and Methods for Access Based Refresh Dperations"; filed Apr. 28, 2022; pp. all pages of the application as filed.
U.S. Appl. No. 17/731,645, titled "Apparatuses and Methods for Access Based Targeted Refresh Operations", filed Apr. 28, 2022; pp. all pages of application as filed.

* cited by examiner

US 11,615,831 B2

APPARATUSES AND METHODS FOR MEMORY MAT REFRESH SEQUENCING

BACKGROUND

Information may be stored on individual memory cells of the memory as a physical signal (e.g., a charge on a capacitive element). The memory may be a volatile memory, and the physical signal may decay over time (which may degrade or destroy the information stored in the memory cells). It may be necessary to periodically refresh the information in the memory cells by, for example, rewriting the information to restore the physical signal to an initial value.

An auto-refresh operation may be carried out where different groups of memory cells are periodically refreshed in a sequence. A refresh signal may be periodically activated. One or more refresh addresses may be refreshed responsive to the activations of the refresh signal. The refresh addresses may be provided following a particular order to ensure reliable operation of the memory.

DETAILED DESCRIPTION

Figure 1:
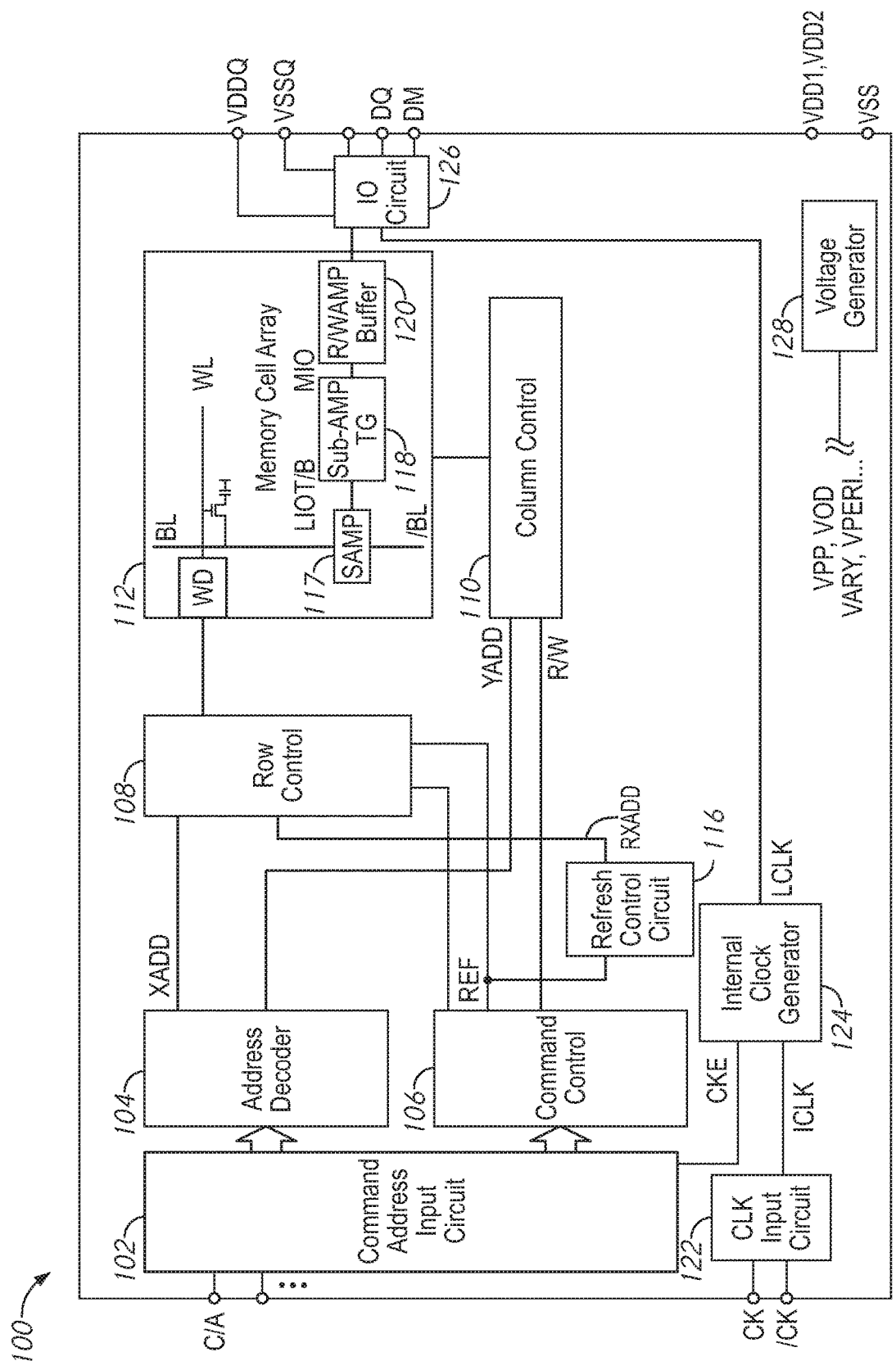
FIG. 1 is a block diagram of a semiconductor device according to an embodiment of the present disclosure.

The following description of certain embodiments is merely exemplary in nature and is in no way intended to limit the scope of the disclosure or its applications or uses. In the following detailed description of embodiments of the present systems and methods, reference is made to the accompanying drawings which form a part hereof, and which are shown by way of illustration specific embodiments in which the described systems and methods may be practiced. These embodiments are described in sufficient detail to enable those skilled in the art to practice presently disclosed systems and methods, and it is to be understood that other embodiments may be utilized and that structural and logical changes may be made without departing from the spirit and scope of the disclosure. Moreover, for the purpose of clarity, detailed descriptions of certain features will not be discussed when they would be apparent to those with skill in the art so as not to obscure the description of embodiments of the disclosure. The following detailed description is therefore not to be taken in a limiting sense, and the scope of the disclosure is defined only by the appended claims.

A memory cell array may include a large number of memory cells, which may be organized at the intersection of rows (word lines) and columns (bit lines). A memory cell array may be organized into a number of memory banks. Each memory bank may include a number of sets of memory mats. Each memory mat may include a number of word lines and bit lines (and their respective memory cells). A memory address which specifies a particular row or column of the memory may thus include a number of bits which specify the bank, a number of bits which specify the set of memory mats, a number of bits which specify the mat, and a number of bits which specify the particular row or column within the mat. The mats may be laid out such that they extend along the wordline direction. Mats may share certain components, such as sense amplifiers, which may be shared between sets of mats as well. The shared components may be activated when either of the mats which share the shared components are activated (e.g., as part of a refresh).

Information in the memory cells may decay over time. To prevent loss of information, the memory cells may be refreshed on a row-by-row basis. During a refresh operation, the information in one or more rows may be rewritten back to the respective rows. A refresh signal (such as auto-refresh signal AREF) may control a timing of the refresh operations. Each time a refresh operation happens, all of the sets of memory mats within one or more of the banks may be activated, and a wordline in one of the mats of the set may be refreshed in each of the activated sets. For example, a wordline in a first mat in each of the sets will be refreshed responsive to a first activation of the refresh signal, a wordline in a second mat in each of the sets will be refreshed responsive to a second activation of the refresh signal etc. Once all of the mats in each of the sets have been refreshed, the cycle may repeat, and a different wordline in the first mats may be refreshed.

Since the various mats (and sets of mats) may share components, the refresh operation in a given mat may generate noise which may affect nearby mats (e.g., physically adjacent mats) if they perform a subsequent refresh operation. The noise may lead to undesirable outcomes, such as corrupting data stored in the mats during the refresh operation. In order to prevent this, it may be desirable to refresh the mats in a sequence such that each time a mat is refreshed, the next mat in the sequence is not physically adjacent to the refreshed mat (e.g., such that there is at least one other mat between a pair of sequentially refreshed mats). Similarly, since sets of mats may be adjacent to each other, it may be important to ensure that adjacent mats between a pair of adjacent sets (e.g., the last mat of a first set and the first mat of a second set) are not subsequently refreshed either.

The present disclosure is aimed at apparatuses and methods for the sequence of memory mat refreshes. A refresh control circuit may provide a sequence of refresh addresses over time, each of which may indicate that a particular mat in each of the sets of mats should be refreshed. The sequence may be such that each time a mat in a given set is refreshed, the next mat which is refreshed is not adjacent to the mat which was just refreshed. The sequence may be such that adjacent mats are not sequentially refreshed between different sets of memory mats as well as within a set of memory mats. In some embodiments, there may be at least two other mats between each pair of sequentially refreshed mats.

The refresh addresses may each include a portion which is a mat address which specifies a particular mat. The refresh control circuit may change the mat address each time a refresh address is provided to indicate the refresh sequence. In some embodiments, the mat addresses may reflect a refresh order of the mats within the set. In some embodiments, the mat addresses may reflect the physical order of the mats within a set and the refresh control circuit may control the sequence based on the way it counts through the mat addresses to determine the sequence. The refresh control circuit may update the mat addresses based on a predetermined sequence of mat addresses, or may use logic (e.g., counter logic) to generate a new mat address based on a previous mat address in the sequence.

FIG. 1 is a block diagram of a semiconductor device according to at least one embodiment of the disclosure. The semiconductor device 100 may be a semiconductor memory device, such as a DRAM device integrated on a single semiconductor chip.

The semiconductor device 100 includes a memory array 112. In some embodiments, the memory array 112 may include of a plurality of memory banks. Each memory bank includes a plurality of word lines WL, a plurality of bit lines BL and /BL, and a plurality of memory cells MC arranged at intersections of the plurality of word lines WL and the plurality of bit lines BL and /BL. The selection of the word line WL is performed by a row control 108 and the selection of the bit lines BL and /BL is performed by a column control 110. The bit lines BL and /BL are coupled to a respective sense amplifier (SAMP). Read data from the bit line BL or /BL is amplified by the sense amplifier SAMP 117, and transferred to read/write amplifiers 120 over complementary local data lines (LIOT/B), transfer gate (TG) 118, and complementary main data lines (MIO). Conversely, write data outputted from the read/write amplifiers 120 is transferred to the sense amplifier 117 over the complementary main data lines MIO, the transfer gate 118, and the complementary local data lines LIOT/B, and written in the memory cell MC coupled to the bit line BL or /BL.

The semiconductor device 100 may employ a plurality of external terminals that include command and address (C/A) terminals coupled to a command and address bus to receive commands and addresses, clock terminals to receive clocks CK and /CK, data terminals DQ to provide data, and power supply terminals to receive power supply potentials VDD, VSS, VDDQ, and VSSQ.

The clock terminals are supplied with external clocks CK and /CK that are provided to a clock input circuit 122. The external clocks may be complementary. The clock input circuit 122 generates an internal clock ICLK based on the CK and /CK clocks. The ICLK clock is provided to the command control 106 and to an internal clock generator 124. The internal clock generator 124 provides various internal clocks LCLK based on the ICLK clock. The LCLK clocks may be used for timing operation of various internal circuits. The internal data clocks LCLK are provided to the input/output circuit 126 to time operation of circuits included in the input/output circuit 126, for example, to data receivers to time the receipt of write data.

The C/A terminals may be supplied with memory addresses. The memory addresses supplied to the C/A terminals are transferred, via a command/address input circuit 102, to an address decoder 104. The address decoder 104 receives the address and supplies a decoded row address XADD to the row control 108 and supplies a decoded column address YADD to the column control 110. The address decoder 104 may also supply a decoded bank address BARD, which may indicate the bank of the memory array 118 containing the decoded row address XADD and column address YADD. The C/A terminals may be supplied with commands. Examples of commands include timing commands for controlling the timing of various operations, access commands for accessing the memory, such as read commands for performing read operations and write commands for performing write operations, as well as other commands and operations. The access commands may be associated with one or more row address XADD, column address YADD, and bank address BADD to indicate the memory cell(s) to be accessed.

The commands may be provided as internal command signals to a command control 106 via the command/address input circuit 102. The command control 106 includes circuits to decode the internal command signals to generate various internal signals and commands for performing operations. For example, the command control 106 may provide a row command signal to select a word line and a column command signal to select a bit line.

The device 100 may receive an access command which is a row activation command ACT. When the row activation command ACT is received, a bank address BADD and a row address XADD are timely supplied with the row activation command ACT.

The device 100 may receive an access command which is a read command. When a read command is received, a bank address and a column address are timely supplied with the read command, read data is read from memory cells in the memory array 112 corresponding to the row address and column address. The read command is received by the command control 106, which provides internal commands so that read data from the memory array 112 is provided to the read/write amplifiers 120. The read data is output to outside from the data terminals DQ via the input/output circuit 126.

The device 100 may receive an access command which is a write command. When the write command is received, a bank address and a column address are timely supplied with the write command, write data supplied to the data terminals DQ is written to a memory cells in the memory array 112 corresponding to the row address and column address. The write command is received by the command control 106, which provides internal commands so that the write data is received by data receivers in the input/output circuit 126. Write clocks may also be provided to the external clock terminals for timing the receipt of the write data by the data receivers of the input/output circuit 126. The write data is supplied via the input/output circuit 126 to the read/write amplifiers 120, and by the read/write amplifiers 120 to the memory array 112 to be written into the memory cell MC.

The device 100 may also receive commands causing it to carry out refresh operations. The refresh signal AREF may be a pulse signal which is activated when the command control 106 receives a signal which indicates a refresh mode. In some embodiments, the refresh command may be externally issued to the memory device 100. In some embodiments, the refresh command may be periodically generated by a component of the device. In some embodiments, when an external signal indicates a refresh entry command, the refresh signal AREF may also be activated. The refresh signal AREF may be activated once immediately after command input, and thereafter may be cyclically activated at desired internal timing. Thus, refresh operations may continue automatically. A self-refresh exit command may cause the automatic activation of the refresh signal AREF to stop and return to an IDLE state.

The refresh signal AREF is supplied to the refresh control circuit 116. The refresh control circuit 116 supplies a refresh row address RXADD to the row control 108, which may refresh a wordline WL indicated by the refresh row address RXADD. The refresh control circuit 116 may control a timing of the refresh operation, and may generate and provide the refresh address RXADD. The refresh control circuit 116 may be controlled to change details of the refreshing address RXADD (e.g., how the refresh address is calculated, the timing of the refresh addresses), or may operate based on internal logic.

The refresh row address RXADD may indicate that multiple wordlines should be simultaneously refreshed as part of a refresh operation. For example, as discussed in more detail herein, the memory cells may be organized into memory mats which in turn are organized into memory mat sets. The refresh row address RXADD may specify a particular wordline within a mat, and a particular mat within a set, but may not specify a particular mat set. Accordingly, the specified wordline in the specified mat may be simultaneously refreshed in all of the corresponding mats of the other mat sets responsive to the refresh row address RXADD.

When a row is refreshed, the sense amplifiers 117 coupled to the memory cells of that row may be used to rewrite the data back to the row. The sense amplifiers 117 may be arranged into sense amplifier arrays, which may be shared between different memory mats. A sense amplifier 117 is not activated twice in a row during a refresh operation, as residual noise in the sense amplifier 117 from the first refresh operation may interfere with the second refresh operation.

The row refresh addresses RXADD may be provided from the refresh control circuit 116 in a refresh sequence, such that no two memory mats which share sense amplifiers 117 (or other components) between them are refreshed sequentially (e.g., one right after another). Since mats may generally arranged along a line (e.g., along the wordline direction) mats may be considered to be physically adjacent if there is no other mat between them along that line. Other components (e.g., sense amplifiers, conductive elements) may still be positioned between a pair of adjacent mats. In some embodiments, one or more memory mats may share sense amplifiers. For example, physically adjacent memory mats may share a sense amplifier array between them. The refresh addresses RXADD may be provided in a sequence such that no pair of physically adjacent memory mats are refreshed sequentially (e.g., there is at least one other mat between the sequentially refreshed mats). In some embodiments, to further reduce noise, the refresh address sequence may ensure that there are at least two other mats between any pair of sequentially refreshed memory mats.

The refresh control circuit 116 may provide row refresh addresses which include a mat address portion. The value mat address portion may specify a given mat. Responsive to activation of AREF, the refresh control circuit 116 may provide a new refresh address RXADD with an updated mat address portion which indicates a next mat in the refresh sequence. In some embodiments, the refresh control circuit 116 may use logic to determine a next value of the mat address portion based on the previous value of the mat address portion. In some embodiments, the value of the mat address may indicate a refresh order of the mats (e.g., a first mat address is associated with the first mat to be refreshed in the sequence). In some embodiments, the value of the mat address may indicate a physical placement of the mats (e.g., the first mat address is associated with the first mat along a line of mats).

The power supply terminals are supplied with power supply potentials VDD and VSS. The power supply potentials VDD and VSS are supplied to an internal voltage generator circuit 128. The internal voltage generator circuit 128 generates various internal potentials VPP, VOD, VARY, VPERI, and the like based on the power supply potentials VDD and VSS supplied to the power supply terminals. The internal potential VPP is mainly used in the row control 108, the internal potentials VOD and VARY are mainly used in the sense amplifiers SAMP included in the memory array 112, and the internal potential VPERI is used in many peripheral circuit blocks.

The power supply terminals are also supplied with power supply potentials VDDQ and VSSQ. The power supply potentials VDDQ and VSSQ are supplied to the input/output circuit 126. The power supply potentials VDDQ and VSSQ supplied to the power supply terminals may be the same potentials as the power supply potentials VDD and VSS supplied to the power supply terminals in an embodiment of the disclosure. The power supply potentials VDDQ and VSSQ supplied to the power supply terminals may be different potentials from the power supply potentials VDD and VSS supplied to the power supply terminals in another embodiment of the disclosure. The power supply potentials VDDQ and VSSQ supplied to the power supply terminals are used for the input/output circuit 126 so that power supply noise generated by the input/output circuit 126 does not propagate to the other circuit blocks.

Figure 2:
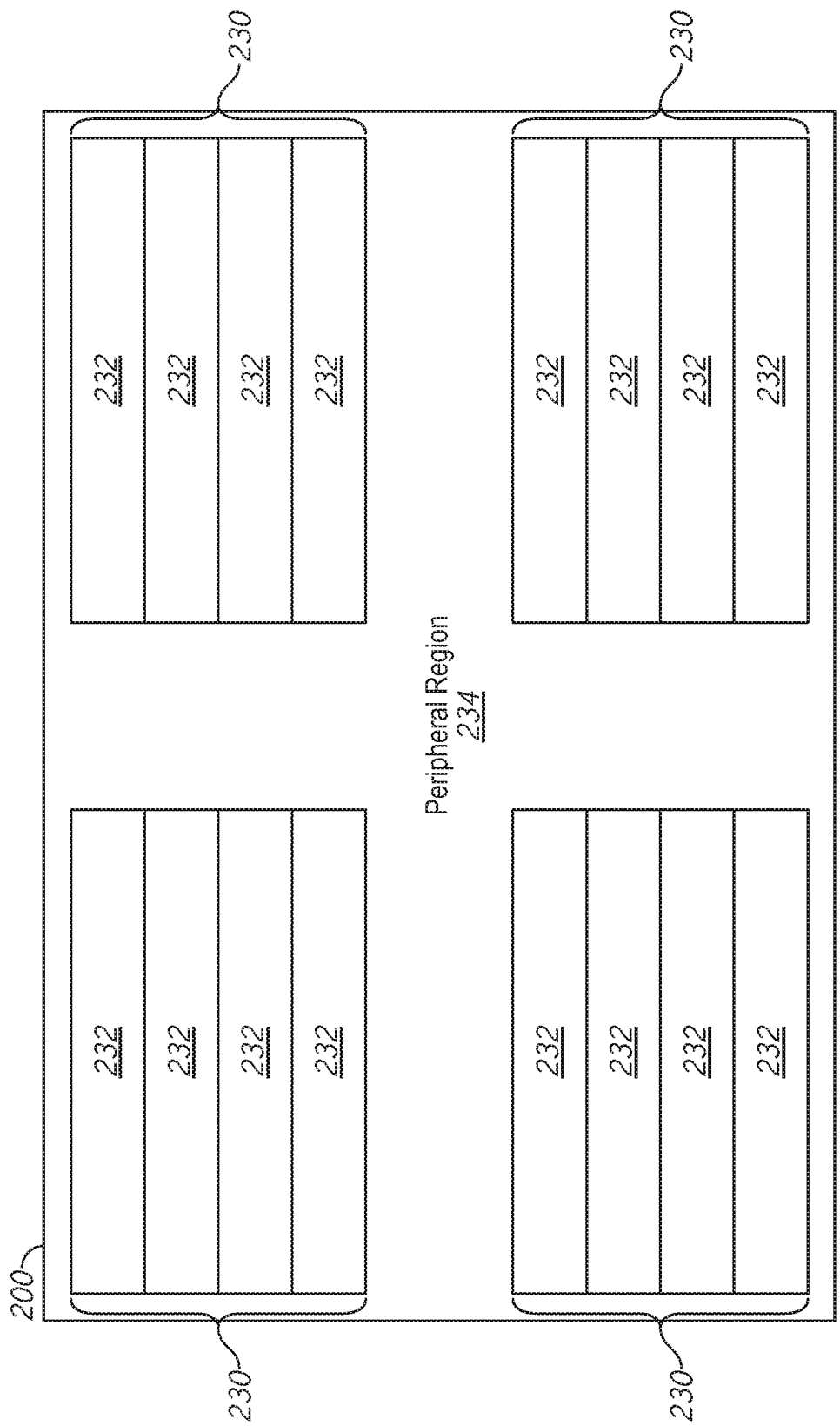
FIG. 2 is a block diagram of a memory array according to an embodiment of the present disclosure.

FIG. 2 is a block diagram of a memory array according to an embodiment of the present disclosure. The memory array 200 may implement the memory array 112 in some embodiments. The memory array 200 shows an example of how memory banks 232 may be laid out in memory array 200. Other arrangements, and other numbers of memory banks 232 may be used in other embodiments.

The example memory array 200 includes 16 memory banks 232. The memory banks 232 are arranged into four groups 230 of four memory banks 232 each. The different groups 230 are separated from each other by a peripheral region 234 of the memory array 200. As described in more detail in FIG. 3, each memory bank 232 may include a number of sets of memory mats, each of which may include a number of memory mats.

A refresh control circuit (e.g., 116 of FIG. 1) may issue a refresh address, which may be associated with one or more of the memory banks 232. One or more of the banks 232 may be activated (e.g., responsive to a bank address) and the refresh address may cause the wordlines associated with the refresh address in the activated banks to be refreshed. Each refresh address may specify one or more wordlines in one or more memory mats of the activated bank(s) to be refreshed. In some embodiments, a plurality of wordlines, each in a different mat set in all the mat sets of all the banks may be refreshed.

Figure 3:
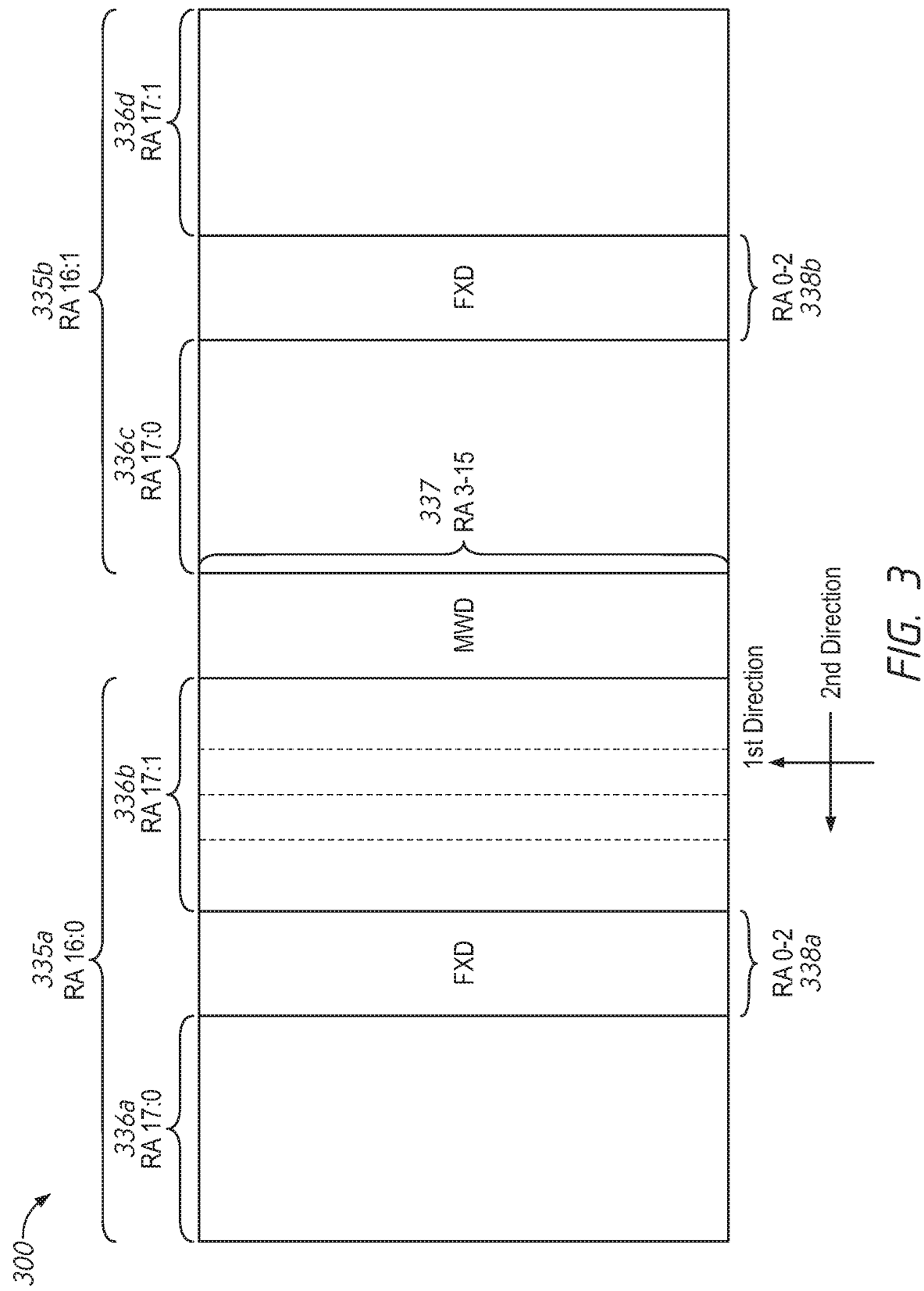
FIG. 3 is a block diagram showing a memory bank according to an embodiment of the present disclosure.

FIG. 3 is a block diagram showing a memory bank according to an embodiment of the present disclosure. The memory bank 300 may implement the memory bank 232 of FIG. 2, in some embodiments. FIG. 3 shows memory mats organized in the memory bank 300, and different portions of a row address RA used to specify different organizational regions of the memory bank 300. FIG. 3 is described with regards to a certain embodiment having a certain number of memory mats, word lines, etc. It should be understood that different embodiments may have different numbers of components organized in any fashion, and that the row address RA may be adjusted accordingly.

The memory bank 300 is organized into four regions 336a-d, each of which is grouped into one of two halves 335a-b. The first and second regions 336a-b are part of the first half 335a, while the third and fourth regions 336c-d are part of the second half 335b. The memory bank 300 may be addressed by a row address RA which is 18 bits long (e.g., from bit 0 to bit 17). The $17^{th}$ and $18^{th}$ bit of the row address (e.g., RA16-17) may be used to specify which of the regions 336a-d is being addressed (e.g., the $17^{th}$ bit RA16 specifies the half 335a or 335b, and the $18^{th}$ bit RA17 specifies the region within that half). The refresh address (e.g., RXADD of FIG. 1) may be a row address RA.

Each of the four regions 336a-d includes a number of memory mats, organized into sets of 8 mats each. The sets of mats are described in more detail in regards to FIGS. 4-5. As shown by the dotted lines in region 336b, the memory mats may be organized into four columns, with each column including 8 sets of memory mats (e.g., 64 total mats in each column). Accordingly, each region 336a-d may include four columns of 64 mats or 1024 mats in total. The columns extend along a first direction, which may be along the word line direction of the mats. The columns may be laid out side-by-side along a second direction which is orthogonal to the first direction (e.g., along the bit line direction). Each of the columns may be coupled to a corresponding data terminal (e.g., DQ of FIG. 1).

Within a region 336a-d, the wordlines within the mats may be accessed by the main wordline driver (MWD) 337 and the FX drivers (FXD) 338a-b. The wordlines in the mats are organized into sets of 8 sub word lines (SWL) which are activated via a main word line (MWL). There may be 128 MWLs in a given mat (e.g., 1024 total word lines per mat). The MWLs may be activated by the MWD 337, and the $4^{th}$ through $10^{th}$ bits RA3-9 of the row address RA may specify which MWL is to be activated. The SWLs may be activated by the FXDs 338a-b, and bits RA0-2 may specify which SWL to activate. Although the MWD 337 and the FXDs 338a-b are both shown as a single block, it should be understood that the block represents many MWDs and FXDs, and that they may be laid out in more (or fewer) regions of the memory bank 300. When a given wordline is activated, two sense amplifiers (not shown) on either side of the mat including the activated wordline are also activated to amplify the data along the activated wordline.

The bits RA10-12 may be used to specify which of the 8 mats within a given set of mats to activate, while the bits RA13-15 may be used to specify which set of mats to activate. In this manner, different portions of the row address RA may specify different regions of the memory bank 300 to activate.

For illustration purposes, the memory bank 300 is shown with a particular number of memory mats, and a particular organization of the wordlines into memory mats. It should be understood that other embodiments may use more or fewer memory mats, which may be arranged in any number of different ways. Similarly, while FIG. 3 shows a particular way that row addresses RA may be used to indicate specific regions of the memory bank 300 it should be understood that any system of addressing the regions of the memory bank 300 may be used in other embodiments.

Figure 4:
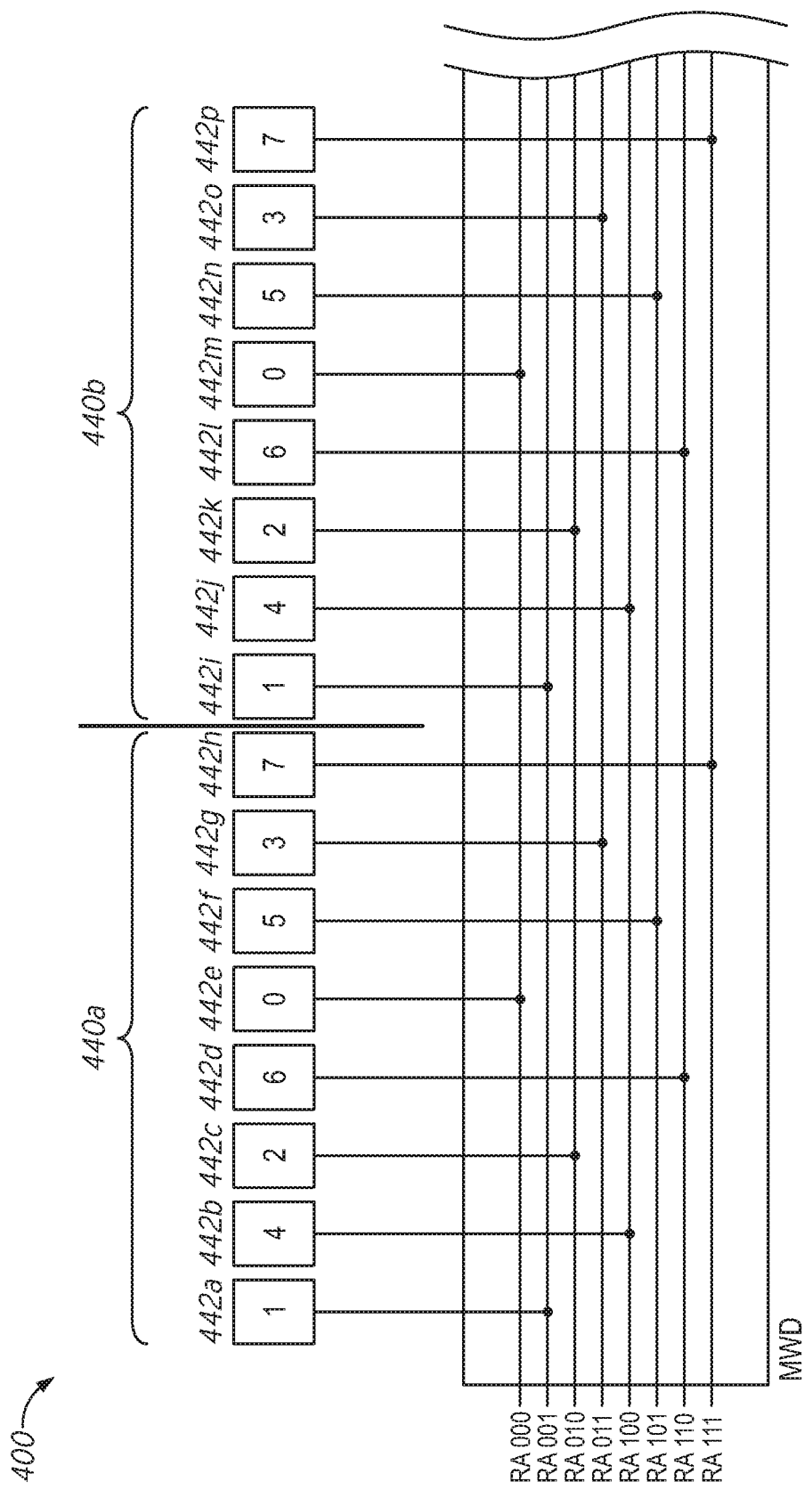
FIG. 4 is a block diagram of sets of memory mats according to an embodiment of the present disclosure.

FIG. 4 is a block diagram of sets of memory mats according to an embodiment of the present disclosure. The sets 440a and 440b may implement two of the eight sets along one of the columns in one of the regions 336a-d, as described in FIG. 3, in some embodiments. Each of the sets 440a and 440b includes eight memory mats 442a-p, with mats 442a-h part of the first set 440a, and mats 442i-p as part of the second set 440b. The mats 442a-p are generally arranged along a line extending along the bit line direction. Although only two sets 440a and 440b are shown in FIG. 4, it should be understood that more sets may be arranged along the bit line direction (e.g., along one of the columns shown in region 336b of FIG. 3). The lower portion of FIG. 4 represents how the bits of the row address are used to indicate different mats 442a-p within a set 440a-b. In particular, the $11^{th}$-$13^{th}$ bits of the row address RA (e.g., RA10-12) may be used to refer to different mats 442a-p within one of the sets 440a-b.

During a refresh operation multiple sets 440a-b may be activated at the same time, and a particular mat in each set may be activated, and may have a particular word line in that mat refreshed. For example, if a row address which includes RA10-12 as 000 is provided, both sets 440a-b may be activated, and a first wordline in mat 442e and mat 442m, both of which are associated with RA10-12=000, may be refreshed. Once a first mat has been refreshed, a next mat in each of the sets 440a-b may be refreshed. For example, a refresh address with RA10-12 as 001 may be provided and mats 442a and 442i may both be refreshed. The numerals shown in each of the boxes representing the mats 442a-p may represent the order that the different mats 442a-p are refreshed in. After the mats labelled 7 (e.g., 442h and 442p) are refreshed, the first mats (e.g., 442e and 442m) may be refreshed.

The order of the refresh operation may be controlled by a refresh signal (e.g., AREF). Each time the refresh signal (e.g. AREF) is activated, a refresh control circuit (e.g., 116 of FIG. 1), may provide a refresh address which specifies (e.g., in RA10-12) a given mat within the sets of mats 440a-b and also specifies a given address within the mat (e.g., with RA0-9). A particular wordline may be refreshed in each of the mats within a set (e.g., the first word line in each of mats 442a-h) and then a next wordline in each of the mats of the set will be refreshed.

Each pair of physically adjacent memory mats (e.g., 442g and 442h, or 442h and 442i) may share a group of sense amplifiers between them. When a wordline in the memory mat is activated (e.g., as part of a refresh operation), data from the activated mat and activated wordline may be read out (or in) through the sense amplifier. The activation of a mat may lead to noise in the sense amplifier bank, which may interfere with the activation of the other mat which shares that sense amplifier bank. For example, if mat 442a is refreshed, a sense amplifier bank shared with mat 442h may be used. That sense amplifier bank may contain residual noise for a time after the refresh operation. If mat 442b were refreshed immediately after mat 442a, then the residual noise in the shared sense amplifier bank may interfere with properly refreshing the data in the mat 442b.

Since the groups of sense amplifiers are shared between adjacent mats 442a-p, a refresh operation may need to be carried out such that the mats 442a-p are refreshed in a sequence such that after each mat is refreshed, the next sequential mat to be refreshed is not physically adjacent to the just refresh mat. The numbers shown in the boxes used to represent the mats 442a-p show an example embodiment of such a refresh sequence.

In the example embodiment of FIG. 4, the sequence that the mats within a set 440a-b are refreshed is controlled by an order of the addresses which are assigned to the different mats 442a-h and 442i-p. The order of the mat addresses (e.g., RA10-12) is arranged in the order the of the refresh sequence. Accordingly, a first mat address (e.g., 000) is assigned to a first mat to be refreshed (e.g., mats 442e and 442m), while a second mat address (e.g., 001) is assigned to a second mat to be refreshed (e.g., mats 442a and 442i), etc.

The first 10 bits of the row address (e.g., bits RA0-9) may refer to a particular word line within a mat. The next three bits (e.g., bits RA10-12) may refer to a particular mat within a set. The remaining bits of the row address (e.g., bits RA13-17) may be ignored during a refresh operation, since all of the sets of mats may be activated together. The three bits (e.g., RA10-12) which specify the memory mat within a set may have 8 possible states, each of which may be associated with one of the eight memory mats 442a-h or 442i-p in a set 440a-b.

The value of the number represented by the three bits (e.g., RA10-12) which specify the mats may increment by one following a binary counting scheme each time a mat is refreshed. Thus, the first address (000) may be assigned to the first mat in the sequence (e.g., mat 442e), the second address (001) may be assigned to the second mat in the sequence (e.g., mat 442a), and so forth. After the eighth mat (e.g., 442h, associated with address 111) is refreshed, the wordline portion of the address (e.g., in RA0-9) may be changed (e.g., incremented) and the sequence may begin again from the first address (000) (e.g., mat 442e).

As may be seen from the sequence of numerals in each of the sets 440a-b, none of the mats are physically adjacent to a mat which is immediately previous or subsequent in the refresh sequence. In other words, mat n is not physically adjacent to mat n−1 or n+1. The sequence may be arranged so that this is true both within a set 440a-b and also between the sets 440a-b. For example, a wordline in the mat 442i is not refreshed immediately after a wordline in mat 442h is refreshed.

Figure 5:
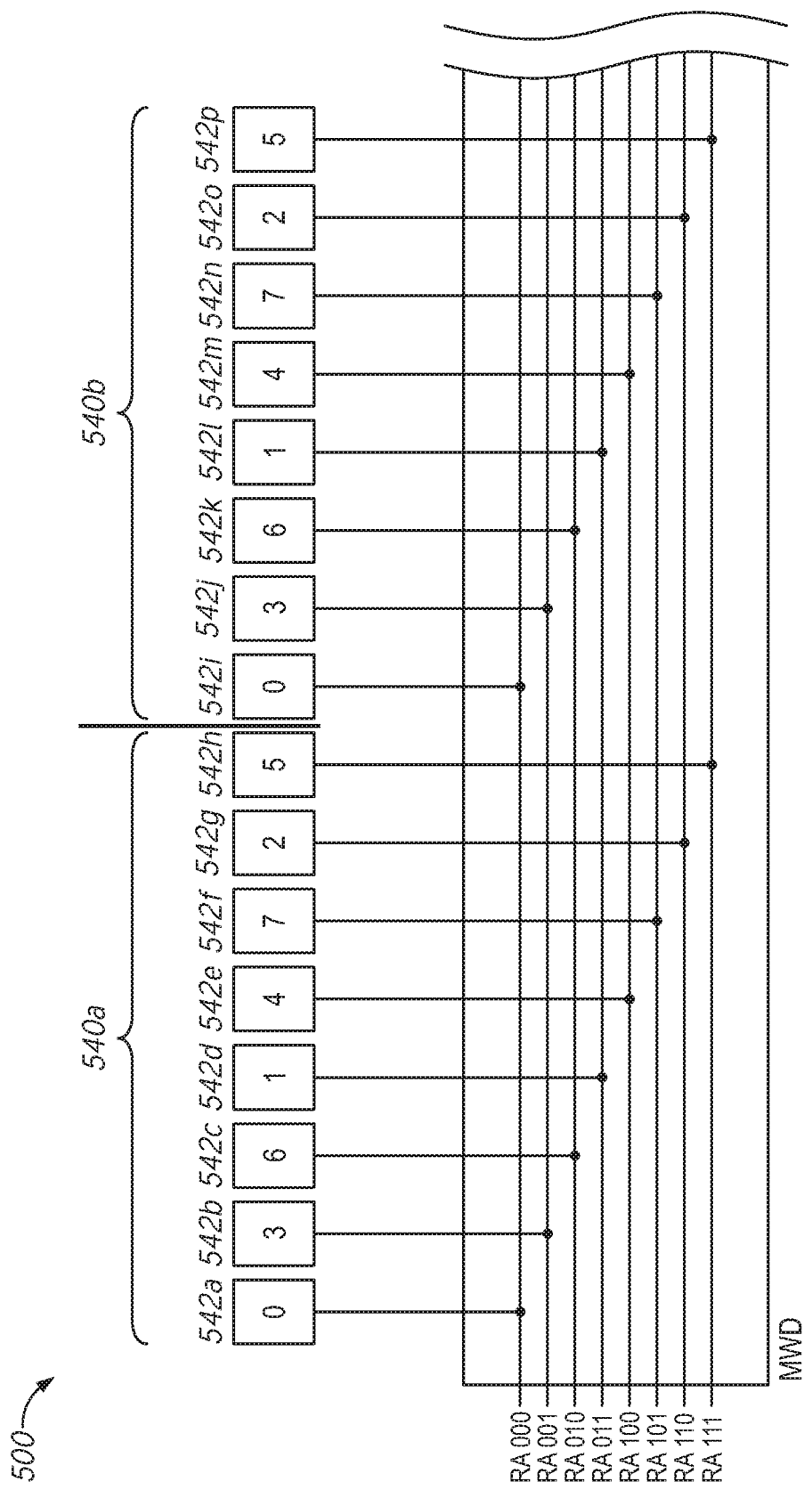
FIG. 5 is a block diagram of sets of memory mats according to an embodiment of the present disclosure.

FIG. 5 is a block diagram of sets of memory mats according to an embodiment of the present disclosure. The memory mat sets 540a and 540b may implement two of the eight sets along one of the columns in one of the regions 336a-d, as described in FIG. 3, in some embodiments. The memory mat sets 540a-b may be generally similar to the memory mat sets 440a-b described in FIG. 4, however the refresh order shown in FIG. 5 is different than the refresh order described in FIG. 4. For the sake of brevity, components and features similar to those previously described will not be described again.

The embodiment of FIG. 5 shows a refresh order where the mats 542a-p of the memory mat sets 540a and 540b are refreshed in a sequence such that after each mat is refreshed, the next mat to be refreshed is not adjacent to the just refresh mat. For example, the next mat in the sequence to be refreshed is separated from the refreshed mat by at least two other mats. Accordingly, each mat is separated from the immediately previous and subsequent mat in the refresh sequence by at least two other mats. For example, after the mat 542a is refreshed, the next activation of the refresh signal may cause the mat 542d to be refreshed. The mats 542a and 542d are separated by the mats 542b and 542c.

In one embodiment, the order that the mats are refreshed may be controlled by the way the addresses are assigned to the different mats within the group, in a manner similar to that described in FIG. 4. For example, the first address (e.g., 000) may be assigned to the first mats to be refreshed (e.g., 542a and 542i), the second address (e.g., 001) may be assigned to the second mats to be refreshed (e.g., 542d and 542l), etc. Thus, each time a mat is refreshed, the mat addressed may be increased by one to refresh a next mat in the sequence. Once all the mats have been refreshed, the wordline address (e.g., RA0-9) may be changed.

In one embodiment, the order that the mats are refreshed may be controlled by the sequence of addresses provided by a refresh control circuit. In this embodiment, the adjacent mats may be assigned sequential addresses and the order of the addresses may indicate the physical order of the mats, as shown by the lower portion of FIG. 5. For example, the mats 542a and 542i may be assigned the first address (e.g., 000), the next adjacent mats 542b and 542j, respectively may be assigned the next address (e.g., 001), and the mats adjacent to those (e.g., 542c, and 542k) may be assigned the third address (e.g., 010), etc.

The refresh control circuit may provide a first refresh address which includes the first mat address 000, and the first mat 542a may be refreshed. The address may then be incremented by three, and a refresh address including the mat address 011 may be provided and may cause the fourth mat 542d to be refreshed. After that, the seventh mat 542g associated with 110 may be refreshed. When the address 110 is incremented by three, it may wrap (e.g., modulo addition) back to the address 001, and the second mat 542b may be refreshed.

Figure 6:
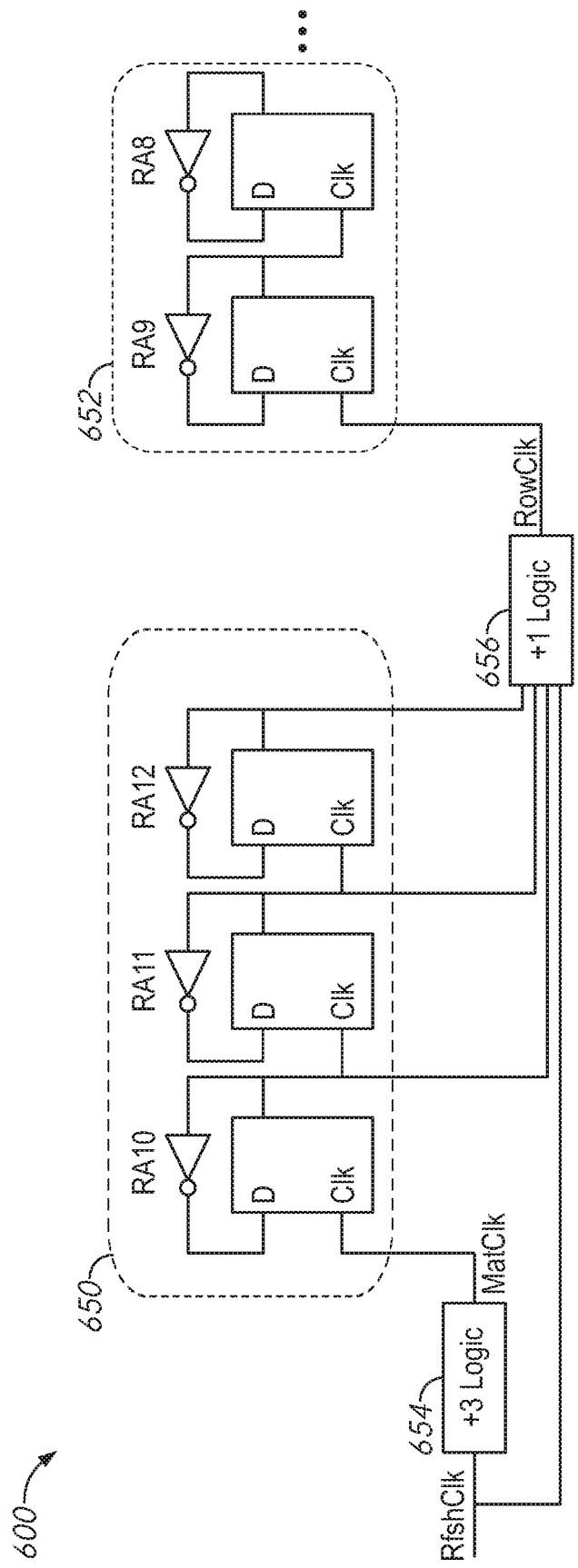
FIG. 6 is a schematic diagram of a portion of a refresh control circuit according to an embodiment of the present disclosure.

FIG. 6 is a schematic diagram of a portion of a refresh control circuit according to an embodiment of the present disclosure. The refresh control circuit 600 may be an implementation of a portion of the refresh control circuit 116 of FIG. 1, in some embodiments. In the example of FIG. 6, the refresh control circuit 600 may be used to generate refresh addresses which follow the mat refresh sequence described in FIG. 5.

The refresh control circuit 600 includes a plurality of latches RA0-RA12. Each of the latches stores a bit of a refresh address RA, which is provided to refresh memory mats in a sequence. The refresh control circuit 600 controls the way in which the bits of the refresh address RA are changed in order to control the sequence that the mats are refreshed in. The number of bits of the RA, and hence the latches, may be split into a row address portion 652 and a mat address portion 650. The row address portion 652 includes a number of bits (in this example, 10 bits labelled RA0-RA9) which are associated with a particular wordline within a memory mat. The mat address portion 650 includes a number of bits (in this example, 3 bits labelled RA10-12) which are associated with a particular mat within a set of memory mats. The refresh address may have additional bits, however they may not be used during a refresh operation.

The refresh control circuit 600 may include counter logic circuits 654 and 656 which control the generation of new refresh addresses as part of a sequence of refresh addresses. The counter logic circuits 654 and 656 may control the way that the latches update the values of the bits of the mat address portion 650 and the row address portion 652 of the refresh address change between each refresh operation. In particular, the bits of the refresh address may be considered to be a binary number, and the counter logic circuits 654 and 656 may increment that number to a next refresh address in a sequence of refresh addresses.

The counter logic circuits 654 and 656 each receive a refresh clock signal RfshClk, which may be used to control the timing of refresh operations. In some embodiments, RfshClk may be linked to the auto-refresh signal AREF. Each activation of RfshClk may indicate that a refresh operation has occurred, and that the values of RA0-RA12 should be updated to generate a new refresh address in the sequence.

The mat address counter 654 may control the values of the mat address portion 650 of the refresh address. The mat address counter 654 receives RfshClk and provides a mat clock MatClk, which updates the values of the latches in the mat address portion 650. The first latch (e.g., RA10) has a clock terminal coupled to MatClk and an output terminal coupled to its own input through an inverter, and to the clock terminal of the next latch e.g., RA11). The second latch (e.g., RA11) has an output coupled to its input through an inverter, and the output is also coupled to a clock terminal of the third latch (e.g., RA12), which also has an output coupled through an inverter to its input. The outputs of all three latches RA10-12 are also coupled to the row address counter 656. Accordingly, when the mat address counter 654 provides MatClk at a high level, the numerical value stored in the mat address portion 650 may increment. The mat address counter 654 may use internal logic to determine how many times to provide MatClk for each activation of RfshClk.

In some embodiments where the values of the mat addresses portion 650 indicate the refresh order, the mat address counter 654 may increase the value of the mat address portion 650 by one for each activation of RfshClk. In some embodiments where the values of the mat addresses indicate the physical order of the mats within a set of mats, the mat address counter 654 may increase the value of the mat address portion 650 by more than one. For example, to achieve the sequence of FIG. 5, the mat address counter 654 may increase the value of the mat address portion 650 by 3. The values of the mat address portion 650 may thus follow a pattern of 000, 011, 110, 001, 100, 111, 010, and 101. Accordingly, each mat which is refreshed is separated by at least two other mats from a previously (and subsequently) refreshed mats in the sequence as described in more detail in FIG. 5.

The row address counter 656 may control the values of the row address portion 652 in a manner similar to the operation of the mat address counter 654. The latches of the row address portion 652 may be coupled together in a manner similar to the latches of the mat address portion 650. The row address counter 656 provides a row address clock signal RowClk based on RfshClk and on the value of the mat address portion 650. In some embodiments, the row address counter 656 may increase the value of the row address portion 652 after a number of activations of RfshClk. The row address portion 652 may be updated after all of the values of the mat address portion 650 have been expressed. In other words, after all of the mats in a set of mats have been refreshed, the row address counter 656 may change the value of the row address portion 652. For example, the row address counter 656 may monitor the value of the mat address portion 650, and only provide RowClk when the mat address portion 650 has reached its final value (e.g., 101) and then provide RowClk the next time RfshClk is provided. In some embodiments, the value of the row address portion 652 may be increased by one (e.g., RowClk may be provided once each time all the values of the mat address portion 650 have been expressed).

Of course, it is to be appreciated that any one of the examples, embodiments or processes described herein may be combined with one or more other examples, embodiments and/or processes or be separated and/or performed amongst separate devices or device portions in accordance with the present systems, devices and methods.

Finally, the above-discussion is intended to be merely illustrative of the present system and should not be construed as limiting the appended claims to any particular embodiment or group of embodiments. Thus, while the present system has been described in particular detail with reference to exemplary embodiments, it should also be appreciated that numerous modifications and alternative embodiments may be devised by those having ordinary skill in the art without departing from the broader and intended spirit and scope of the present system as set forth in the claims that follow. Accordingly, the specification and drawings are to be regarded in an illustrative manner and are not intended to limit the scope of the appended claims.

What is claimed is:

1. An apparatus comprising:
a plurality of memory mats including pairs of memory mats, each pair including two memory mats that share a respective same sense amplifier;
a refresh control circuit configured to refresh one or more of the plurality of memory mats responsive to an activation of a refresh signal, wherein the one or more of the plurality of memory mats refreshed responsive to a given activation are physically separated by at least one other of the plurality of memory mats from any memory mats of the plurality of memory mats refreshed responsive to a next activation of the refresh signal,
wherein no two memory mats of the pairs of memory mats that share the respective same sense amplifier are refreshed sequentially, and
wherein the refresh control circuit comprises:
a plurality of latches configured to store corresponding bits of a refresh address, the plurality of latches comprising a mat address portion and a row address portion, the mat address portion including a first number of latches corresponding to a first number of bits which are associated with the memory mat within a set of memory mats, the row address portion including a second number of latches corresponding to a second number of bits which are associated with wordlines within the memory mats; and
a counter logic circuit configured to:
control updating values of the bits of the mat address portion of a refresh address change between each refresh operation to change the value of the mat address portion by more than one for each activation of the refresh signal; and
control updating values of the bits of the row address portion of the refresh address change between each refresh operation to change the value of the row address portion after a number of activations of the refresh signal or after all of the values of the mat address portion are expressed.

2. The apparatus of claim 1, wherein the plurality of memory mats are organized into a plurality of memory mat sets, and wherein one of the plurality of memory mats in each of the plurality of memory mat sets is refreshed responsive to the activation of the refresh signal.

3. The apparatus of claim 1, wherein the one or more of the plurality of memory mats refreshed responsive to the given activation of the refresh signal are separated from any memory mats refreshed responsive to the next activation of the refresh signal by at least two other of the plurality of memory mats.

4. The apparatus of claim 1, wherein the refresh control circuit is configured to refresh the plurality of memory mats in a sequence which repeats after a last one or more memory mats of the sequence are refreshed.

5. The apparatus of claim 1, wherein responsive to the activation of the refresh signal, a word line is refreshed in each of the one or more of the plurality of memory mats.

6. The apparatus of claim 1, further comprising a plurality of sense amplifier arrays, each of the plurality of sense amplifier arrays associated with a pair of the plurality of memory mats, wherein each time the one or more of the plurality of memory mats is refreshed, the associated ones of the plurality of sense amplifier arrays are activated.

7. The apparatus of claim 6, wherein none of the plurality of sense amplifier arrays are activated by two sequential activations of the refresh signal.

8. An apparatus, comprising:
a memory bank including a plurality of mat sets each comprising a plurality of memory mats arranged along a line;
a refresh control circuit configured to provide a sequence of refresh addresses associated with one or more memory banks including the memory bank, each including a mat address, wherein the mat address is associated with one of the plurality of memory mats in each of the plurality of mat sets; and
a row control circuit configured to refresh the memory mats associated with each refresh address, wherein each and every refresh address of the sequence of refresh addresses specifies memory mats of one of the plurality of memory mats in each of the plurality of mat sets which are each physically separated by at least one other of the plurality of memory mats from the memory mats specified by immediately previous or subsequent refresh addresses of the sequence,
wherein a plurality of wordlines specified by each refresh address of the sequence of refresh addresses, each in a different mat set in the plurality of mat sets of the one or more memory banks, are configured to be refreshed,
wherein the refresh control circuit comprises counter logic, the counter logic configured to:
  change a value of the mat address in a next refresh address each time a refresh address is provided; and
  reset the value of the mat address to an initial value when all of the plurality of memory mats in a given one of the plurality of mat sets have been refreshed,
wherein each of the refresh addresses comprises a row address associated with each of the plurality of wordlines in each of the plurality of memory mats, and
wherein a value of the row address is changed after all of the plurality of memory mats in the given one of the plurality of mat sets are refreshed.

9. The apparatus of claim 8, wherein the mat address has a number of values matching a number of the plurality of memory mats in each of the plurality of mat sets.

10. The apparatus of claim 8, wherein the value of the mat address indicates the sequence in which the plurality of memory mats in a mat set are refreshed and wherein the counter logic is configured to increase the value of the mat address by one after each refresh.

11. The apparatus of claim 10, wherein no two memory mats sharing a same sense amplifier are refreshed sequentially.

12. The apparatus of claim 8, wherein the value of the mat address indicates a position of the associated one of the plurality of mats in one of the plurality of mat sets and wherein the counter logic is configured to increase the value of the mat address by more than one after each refresh.

13. A method, comprising:
activating a refresh signal;
updating a refresh address from a previous refresh address of a sequence of refresh addresses to a current refresh address of the sequence of refresh addresses and providing the current refresh address responsive to the activation of the refresh signal, each of the refresh addresses being associated with one or more memory banks; and
refreshing a plurality of wordlines associated with the current refresh address, each in a different mat set in a plurality of mat sets of the one or more memory banks,
wherein the plurality of memory cell mats are arranged along a line,
wherein none of the plurality of memory cell mats are physically adjacent to memory mats associated with the previous refresh address, p1 wherein no two memory cell mats of the plurality of memory mats shared with a same sense amplifier are refreshed sequentially
wherein the refresh address includes a mat address portion and a row address portion, and
wherein updating the refresh address comprises:
  updating a value of the mat address portion by more than one responsive to each activation of the refresh signal; and
  updating a value of the row address portion after updating the value of the mat address portion a number of times.

14. The method of claim 13, wherein each of the plurality of memory cell mats associated with the current refresh address are separated from the memory mats associated with the previous refresh address by at least two other of the plurality of mats.

15. The method of claim 13, the wordline in each of the plurality of memory cell mats are refreshed simultaneously responsive to the refresh signal.

\* \* \* \* \*

UNITED STATES PATENT AND TRADEMARK OFFICE
CERTIFICATE OF CORRECTION

PATENT NO. : 11,615,831 B2  
APPLICATION NO. : 16/286187  
DATED : March 28, 2023  
INVENTOR(S) : Nobuo Yamamoto Page 1 of 1

It is certified that error appears in the above-identified patent and that said Letters Patent is hereby corrected as shown below:

In the Claims

| Column | Line | Claim | Reads | Should Read |
|---|---|---|---|---|
| 14 | 24 | 13 | memory mats associated with the previous refresh address, p1 wherein | memory mats associated with the previous refresh address, wherein |

Signed and Sealed this  
Sixth Day of June, 2023

Katherine Kelly Vidal  
*Director of the United States Patent and Trademark Office*